US009024399B2

(12) United States Patent  
Guo

(10) Patent No.: US 9,024,399 B2  
(45) Date of Patent: May 5, 2015

(54) PERPENDICULAR STT-MRAM HAVING LOGICAL MAGNETIC SHIELDING

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 0 days.

(21) Appl. No.: 14/266,825

(22) Filed: May 1, 2014

(65) Prior Publication Data

US 2014/0327096 A1 Nov. 6, 2014

Related U.S. Application Data

(60) Provisional application No. 61/818,539, filed on May 2, 2013.

(51) Int. Cl.
*H01L 21/00* (2006.01)
*H01L 43/10* (2006.01)
*H01L 43/12* (2006.01)

(52) U.S. Cl.
CPC ............... *H01L 43/10* (2013.01); *H01L 43/12* (2013.01)

(58) Field of Classification Search
USPC ................................ 257/421, 295; 438/3, 212
See application file for complete search history.

(56) References Cited

U.S. PATENT DOCUMENTS

| 7,067,863 B2 * | 6/2006 | Guo | 257/295 |
|---|---|---|---|
| 8,183,665 B2 * | 5/2012 | Bertin et al. | 257/529 |
| 8,338,869 B2 * | 12/2012 | Gaidis | 257/295 |
| 2011/0076784 A1 * | 3/2011 | Druist et al. | 438/3 |
| 2012/0299134 A1 * | 11/2012 | Jan et al. | 257/421 |
| 2012/0326250 A1 * | 12/2012 | Gaidis et al. | 257/421 |
| 2013/0069182 A1 * | 3/2013 | Ohsawa et al. | 257/421 |
| 2013/0343117 A1 * | 12/2013 | Lua et al. | 365/158 |
| 2014/0106523 A1 * | 4/2014 | Koldiaev et al. | 438/212 |
| 2014/0175582 A1 * | 6/2014 | Apalkov et al. | 257/425 |
| 2014/0198564 A1 * | 7/2014 | Guo | 365/158 |
| 2014/0203341 A1 * | 7/2014 | Guo | 257/295 |
| 2014/0210025 A1 * | 7/2014 | Guo | 257/421 |
| 2014/0217487 A1 * | 8/2014 | Guo | 257/295 |
| 2014/0231940 A1 * | 8/2014 | Xia et al. | 257/421 |
| 2014/0241047 A1 * | 8/2014 | Guo | 365/158 |
| 2014/0246741 A1 * | 9/2014 | Guo | 257/421 |
| 2014/0247653 A1 * | 9/2014 | Wang et al. | 365/158 |
| 2014/0252439 A1 * | 9/2014 | Guo | 257/295 |
| 2014/0254252 A1 * | 9/2014 | Guo | 365/158 |
| 2014/0301135 A1 * | 10/2014 | Guo | 365/158 |
| 2014/0312441 A1 * | 10/2014 | Guo | 257/427 |
| 2014/0319632 A1 * | 10/2014 | Guo | 257/421 |
| 2014/0327096 A1 * | 11/2014 | Guo | 257/421 |
| 2014/0328116 A1 * | 11/2014 | Guo | 365/158 |

* cited by examiner

*Primary Examiner* — Laura Menz

(57) ABSTRACT

A perpendicular STT-MRAM comprises apparatus and a method of manufacturing a plurality of magnetoresistive memory element having local magnetic shielding. As an external perpendicular magnetic field exists, the permeable dielectric layers, the permeable bit line and the permeable bottom electrode are surrounding and have capability to absorb and channel most magnetic flux surrounding the MTJ element instead of penetrate through the MTJ element. Thus, magnetization of a recording layer can be less affected by the stray field during either writing or reading, standby operation.

26 Claims, 1 Drawing Sheet

PERPENDICULAR STT-MRAM HAVING LOGICAL MAGNETIC SHIELDING

RELATED APPLICATIONS

This application claims the priority benefit of U.S. Provisional Application No. 61,818,539 filed on May 2, 2013, which is incorporated herein by reference.

BACKGROUND OF THE INVENTION

1. Field of the Invention

This invention relates generally to a perpendicular spin-transfer-torque magnetic-random-access memory (MRAM) cell having permeable dielectric layers for reducing external perpendicular stray field interference.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller. In a so-called perpendicular STT-MRAM, both two magnetization films in an MTJ stack have easy axis of magnetization in a direction perpendicular to the film plane due to their strong magnetic crystalline anisotropy and interface interaction induced anisotropy, shape anisotropies are not used, and accordingly, the device shape can be made smaller than that of an in-plane magnetization type. Also, variance in the easy axis of magnetization can be made smaller. Accordingly, both miniaturization and lower currents can be expected to be achieved while a thermal disturbance resistance is maintained. In another word, perpendicular STT-MRAM having high speed, large capacities and low-power-consumption operations can potentially replace the conventional semiconductor memory used in electronic chips, especially mobile chips for power saving and non-volatility.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

The thermal stability of the magnetic orientation in a MRAM cell is a critical parameter which has to be kept high enough for a good data retention, and is typically characterized by the so-called thermal factor which is proportional to the perpendicular anisotropy as well as the volume of the recording layer cell size.

Combining writing, reading and thermal stability factors, an MRAM has to be well designed and manufactured with tight processing variations. However, in a real application, especially in mobile application, there is risk that an MRAM chip gets close to an external field, which could have potentially interference with data recording, yielding incorrect data writing, or interference with reading, yielding unwanted data writing. In an in-plane STT MRAM, this can be easily addressed by adding a soft magnetic shield above MRAM array. It becomes very challenging in a perpendicular STT MRAM design, since a planar shield only provides shielding effect on in-plane field and there is no shielding effect on an external perpendicular stray field.

Thus, it is desirable to provide perpendicular STT-MRAM structures having a local shielding to reduce a perpendicular stray field to very low level to achieve a good data retention without data destruction by external stray field.

BRIEF SUMMARY OF THE PRESENT INVENTION

The present invention comprises a perpendicular magnetoresistive cell having a local shielding for reduction of an external perpendicular stray field. The perpendicular magnetoresistive cell in the invention has a permeable bit line, a top electrode or cap layer, an MTJ stack, a seed layer, an etching stop layer, a permeable bottom electrode connecting to a VIA of a select transistor, and a dielectric ALD layer and a surrounding magnetic permeable insulating dielectric layers.

An exemplary embodiment includes a perpendicular spin-transfer-torque magnetoresistive memory cell including a permeable bit line and a permeable bottom electrode. The perpendicular spin-transfer torque magnetoresistive memory cell further includes an insulating ALD layer deposited immediately surrounding a patterned stack consisting of the MTJ layer, the cap layer and seed layer and refilled dielectric layer having high magnetic permeability immediately surrounding the ALD layer.

The permeable bit line and bottom electrode can be a conductive alloy comprising at least one magnetic element selected from Ni, Co and Fe and at least one highly conductive element selected from Cu, Al, Ag, Au, Ru, etc. The permeable bit line and bottom electrode can also a multi-layer consisting of at least a magnetic alloy layer and at least a highly conductive non-magnetic or magnetic layer.

The film structure of magnetic permeable dielectric layer constitutes of an array of non-oxidized or partially oxidized Co (or CoFe) particle in insulating (e.g., zirconium oxide, AlOx, MgO, SiO2, etc) matrix. The cobalt particles with the characteristic size of several nanometers had nearly spherical or oval shape and rather narrow distribution in diameters. Due to relatively regular structure, such composites are insulators at ferromagnetic metal content significantly higher than that for the random systems. Magnetic properties of the magnetic nanocomposites are determined by the large magnetization and magnetic anisotropy of Co (or CoFe) nanoparticles as well as a relatively high (of thousands $\mu\Omega cm$) electric resistance of the material before the insulator—metal percolation transition.

The permeable dielectric films can be prepared by reactive sputtering under an oxygen-argon atmosphere using a target of Co (or CoFe) —Zr (or Al, Mg, Si, etc) alloys. The microstructure was composed of base-centered-cubic Co (or CoFe) nano-grains, where nano-particles of amorphous Zr (or Al, Mg, Si, etc) oxide are dispersed. These oxide nano-particles have a function to hinder the growth of Co (or CoFe) grains during the film deposition, causing low coercivity. The high nano-composite permeability is related to the process of spontaneous (thermal) reorientation of nano-particles magnetic moments from one equilibrium position to another. Such a process dominates at relatively high temperatures and low frequencies for composites consisting of small ferromagnetic particles with low value of magnetic anisotropy constant.

The permeable dielectric films can also be prepared by alternatively depositing a thin magnetic layer using a target of Co (or CoFe) and insulating non-magnetic dielectric layer, such as AlOx, MgO, SiO2, etc. As a thin magnetic layer is in the range of less than 1.5 nanometers, nano-particles of magnetic materials would be formed through a wetting effect among dielectric layers.

As a thin ALD layer and permeable dielectric layer are made to surround an MRAM stack element to combine permeable bit line and bottom electrode, an increased magnetic permeability can reduce the stray field, especially the perpendicular field component on the MTJ element. In a perpendicular MRAM cell, as an external perpendicular field is applied, permeable dielectric layers will absorb and channel most magnetic flux surrounding the MTJ element instead of penetrate through the MTJ element. Thus, magnetization of a recording layer can be less affected by the stray field during either writing or reading, standby operation.

Various embodiments will be described hereinafter with reference to the companying drawings. The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

In general, according to each embodiment, there is provided a perpendicular magnetoresistive memory cell comprising:
    a magnetic permeable bottom electrode provided on a surface of a substrate connecting to a VIA of a select transistor;
    an etching stop layer provided on the top surface of the bottom electrode;
    an MTJ stack consisting of a seed layer provided on the top surface of the etching stop layer, a perpendicular MTJ multilayer provided on the top surface of the seed layer and a cap layer provided on the top surface of the perpendicular MTJ stack layer as an upper electric electrode;
    a dielectric ALD layer provided on the top surface of the etching layer and surrounding the side wall of MTJ stack;
    a magnetic permeable dielectric layer provided on the top surface and surrounding the side wall of the dielectric ALD layer;
    a permeable bit line provided on the top surface of the cap layer and the magnetic permeable dielectric layer.

An exemplary embodiment includes a perpendicular spin-transfer-torque magnetoresistive memory cell including a permeable bit line, a permeable bottom electrode and an insulating ALD layer deposited immediately surrounding a patterned stack consisting of the MTJ layer, the cap layer and seed layer and refilled dielectric layer having high magnetic permeability immediately surrounding the ALD layer. The film structure of magnetic permeable dielectric layer constitutes of an array of non-oxidized or partially oxidized Co (or CoFe) particle in insulating (e.g., zirconium oxide, AlOx, MgO, SiO2, etc) matrix. The cobalt particles with the characteristic size of several nanometers had nearly spherical or oval shape and rather narrow distribution in diameters. Due to relatively regular structure, such composites are insulators at ferromagnetic metal content significantly higher than that for the random systems. Magnetic properties of the magnetic nanocomposites are determined by the large magnetization and magnetic anisotropy of Co (or CoFe) nanoparticles as well as a relatively high (of thousands $\mu\Omega cm$) electric resistance of the material before the insulator—metal percolation transition.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

Figure 1:
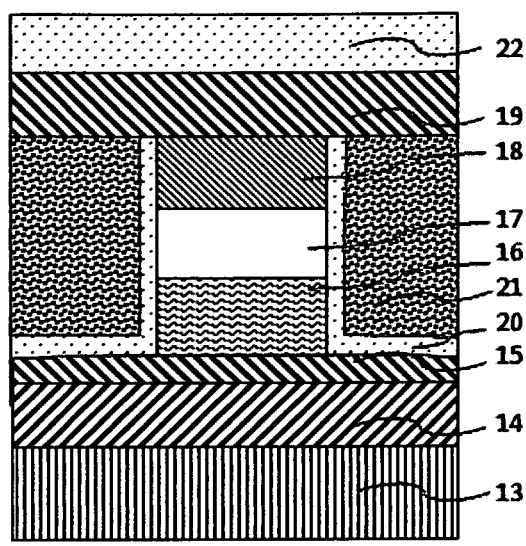
FIG. 1 is a cross-section of one memory cell in a perpendicular STT-MRAM array having an MTJ element.

FIG. 1 is a cross-sectional view of a magnetoresistive memory cell in a perpendicular STT-MRAM array having a permeable dielectric surrounding layer. The magnetoresistive memory cell 30 is configured by a VIA of a select transistor 13, a permeable bottom electrode 14, an etching stop layer 15, a seed layer 16, an MTJ multilayer 17, cap layer 18, a permeable bit line 19, a insulating ALD layer, 20, a magnetic permeable dielectric layer 21, an insulating preservation layer 22.

Figure 2:
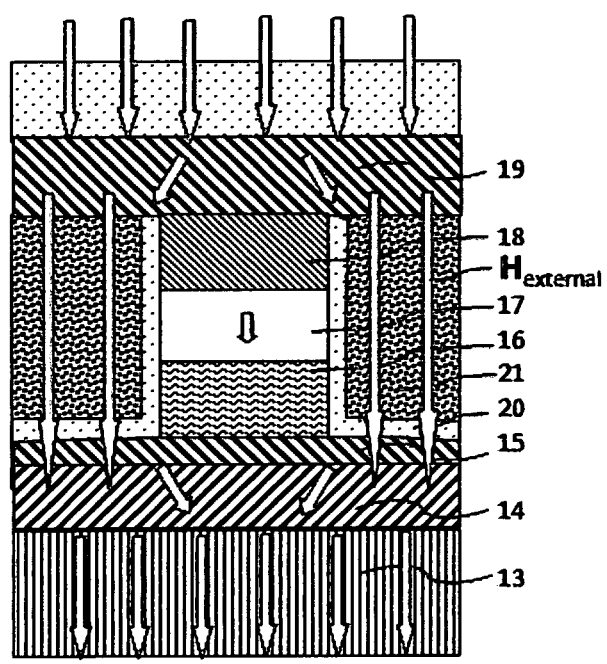
FIG. 2 is a cross-section of one memory cell in a perpendicular STT-MRAM array having an MTJ element, in which permeable dielectric layers, permeable bit line and bottom electrode will absorb and channel most magnetic flux surrounding the MTJ element instead of penetrate through the MTJ element.

FIG. 2 show magnetoresistive element 30 illustrating the magnetic shielding mechanism of a perpendicular spin-transfer-torque magnetoresistive memory. As a vertical magnetic external field is applied, the permeable dielectric layers, the permeable bit line and the permeable bottom electrode will absorb and channel most magnetic flux surrounding the MTJ element instead of penetrate through the MTJ element. As the permeability of the permeable dielectric layer reaches 5, the remaining perpendicular stray field on the recording layer would be reduced by 70% to 95%. Thus, magnetization of a recording layer can be less affected by the stray field during either writing or reading, standby operation.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A perpendicular spin-transfer torque magnetoresistive memory comprising a control circuitry and at least one memory cell comprising:
   a permeable bottom electrode provided on a surface of a substrate and connecting to a VIA of a select transistor;
   an etching stop layer provided on the top surface of the bottom electrode;
   an MTJ stack consisting of a seed layer provided on the top surface of the etching stop layer, a perpendicular MTJ multilayer provided on the top surface of the seed layer and a cap layer provided on the top surface of the perpendicular MTJ stack layer as an upper electric electrode;
   a dielectric ALD layer provided on the top surface of the etching stop layer and on the side wall of MTJ stack;
   a magnetic permeable dielectric layer provided on the top surface and surrounding the side wall of the dielectric ALD layer;
   a permeable bit line provided on the top surface of the cap layer and the magnetic permeable dielectric layer.

2. The element of claim 1, wherein said ALD layer is made of an oxide, or nitride, or oxynitride, preferred to be selected from the group of AlOx, SiO2, SiNx, AlNx, MgO, TiO, AlON.

3. The element of claim 1, wherein said ALD layer has a thickness in a range from 1 nm to 5 nm.

4. The element of claim 1, wherein said permeable dielectric layer is made of material having an array of non-oxidized or partially oxidized magnetic nano-particles in an insulating matrix.

5. The element of claim 1, wherein said permeable dielectric layer is made by reactive sputtering under an oxygen-argon atmosphere using a target of magnetic alloy.

6. The element of claim 4, wherein said magnetic alloy is selected from the group of MN, M is Co or CoFe, CoFeB, CoFeNi, CoB, FeB, CoPt, FePt, CoPd, FePd, CrO2, MnO2, and N is Zr, Mg, Al, Ti, Si, Ta, Hf.

7. The element of claim 4, wherein said magnetic nano-particles are made of ferromagnetic material or ferrimagnetic material and having diameters in a range of 0.3 nm and 2 nm.

8. The element of claim 4, wherein said magnetic nano-particles are preferred to be selected from Co, CoFe, CoFeNi, CoFeB, CoPt, FePt, or other Co alloy, Fe alloy, CrO2, MnO2.

9. The element of claim 4, wherein said insulating matrix is made of dielectric material, preferred to be selected from the group of AlOx, SiO2, SiNx, AlNx, MgO, TiO, AlON, ZrOx, TaOx, HfOx.

10. The element of claim 1, wherein said permeable dielectric layer is made of multilayer prepared by alternatively depositing a thin magnetic layer using a target of magnetic material and insulating non-magnetic dielectric layer.

11. The element of claim 10, wherein said insulating non-magnetic dielectric layer is made of dielectric material, preferred to be selected from the group of AlOx, SiO2, SiNx, AlNx, MgO, TiO, AlON.

12. The element of claim 10, wherein said magnetic material is preferred to be selected from Co, CoFe, CoFeNi, CoFeB, CoPt, FePt, or other Co alloy, Fe alloy, CrO2, MnO2.

13. The element of claim 1, wherein said etching stop layer is made of a metal layer, preferred to be selected from Ta, TaN.

14. The element of claim 1, wherein said MTJ multilayer further consisting of a recording layer, a tunneling barrier and a reference layer 15. The element of claim 14, wherein said tunnel barrier layer is made of a metal oxide or a metal nitride, a metal oxynitride, preferred to be MgO, ZnO, MgZnO, MgN, MgON.

16. The element of claim 1, wherein said recording layer and said reference layer are ferromagnetic layers having perpendicular anisotropies.

17. The element of claim 1, wherein said permeable dielectric layer has a magnetic permeability larger than 5, preferred to be more than 10.

18. The element of claim 1, wherein said permeable bit line is made of a conductive alloy comprising at least one magnetic element selected from Ni, Co and Fe and at least one highly conductive element selected from Cu, Al, Ag, Au, Ru.

19. The element of claim 1, wherein said permeable bottom electrode is made of a conductive alloy comprising at least one magnetic element selected from Ni, Co and Fe and at least one highly conductive element selected from Cu, Al, Ag, Au, Ru.

20. The element of claim 1, wherein said permeable bit line is a multi-layer consisting of at least a magnetic alloy layer and at least a highly conductive non-magnetic or magnetic layer.

21. The element of claim 1, wherein said permeable bottom electrode is a multi-layer consisting of at least a magnetic alloy layer and at least a highly conductive non-magnetic or magnetic layer.

22. The element of claim 18, wherein the magnetic permeability of said permeable bit line is 5 or higher.

23. The element of claim 19, wherein the magnetic permeability of said permeable bottom electrode is 5 or higher.

24. The element of claim 20, wherein the magnetic permeability of permeable sub-layer of said bit line multilayer is 10 or higher.

25. The element of claim 21, wherein the magnetic permeability of permeable sub-layer of said bottom electrode multilayer is 10 or higher.

26. A method of manufacturing a magnetoresistive memory element comprising:
   deposit a permeable bottom electrode on a surface of a substrate and connecting to a VIA of a select transistor;
   deposit an etching stop layer on the top surface of the bottom electrode;
   deposit an MTJ stack consisting of a seed layer on the top surface of the etching stop layer, a perpendicular MTJ multilayer on the top surface of the seed layer and a cap layer on the top surface of the perpendicular MTJ stack layer as an upper electric electrode;

pattern the MTJ stack using a lithography technique and a RIE process down to the top surface of the etching stop layer;

deposit a conformal insulating dielectric ALD layer on the top surface of the etching stop layer and on the side wall of MTJ stack;

deposit a magnetic permeable dielectric layer provided on the top surface and surrounding the side wall of the dielectric ALD layer;

conduct a chemical mechanical polishing (CMP) to flatten the upper surface;

deposit and pattern a permeable bit line on the top surface of the cap layer and the magnetic permeable dielectric layer.

\* \* \* \* \*